(12) United States Patent
Doi et al.

(10) Patent No.: US 7,744,770 B2
(45) Date of Patent: Jun. 29, 2010

(54) DEVICE TRANSFER METHOD

(75) Inventors: Masato Doi, Kanagawa (JP); Toyoharu Oohata, Tokyo (JP)

(73) Assignee: Sony Corporation, Tokyo (JP)

( * ) Notice: Subject to any disclaimer, the term of this patent is extended or adjusted under 35 U.S.C. 154(b) by 422 days.

(21) Appl. No.: 11/158,980

(22) Filed: Jun. 22, 2005

(65) Prior Publication Data
US 2006/0007297 A1 Jan. 12, 2006

(30) Foreign Application Priority Data
Jun. 23, 2004 (JP) ............................ P2004-184927

(51) Int. Cl.
*B44C 1/22* (2006.01)
*G01L 21/30* (2006.01)

(52) U.S. Cl. .............................. 216/65; 216/59; 216/60; 219/121.6; 219/121.61; 219/121.68

(58) Field of Classification Search .................. 216/65; 219/121.6, 121.61, 121.68
See application file for complete search history.

(56) References Cited

U.S. PATENT DOCUMENTS

| | | | | |
|---|---|---|---|---|
| 4,420,760 A | * | 12/1983 | Phillips | ...................... 347/250 |
| 5,461,601 A | * | 10/1995 | Shinada et al. | .......... 369/112.28 |
| 5,472,550 A | * | 12/1995 | Periasamy | ................ 156/345.1 |
| 5,978,189 A | * | 11/1999 | Habu | ........................... 360/135 |
| 6,200,405 B1 | * | 3/2001 | Nakazawa et al. | ........... 156/248 |
| 7,193,759 B2 | * | 3/2007 | Takeuchi et al. | ............. 359/216 |
| 2003/0087476 A1 | * | 5/2003 | Oohata et al. | ................ 438/108 |
| 2004/0066569 A1 | * | 4/2004 | Taniguchi | .................... 359/883 |

FOREIGN PATENT DOCUMENTS

JP  2004-285171  10/2004

* cited by examiner

*Primary Examiner*—Shamim Ahmed
(74) *Attorney, Agent, or Firm*—K&L Gates LLP

(57) ABSTRACT

A device transfer method is provided. The device transfer method is disclosed by which, when a laser ablation technique is used to selectively exfoliate devices arranged on a substrate, the energy is transmitted efficiently to transfer the devices with a high degree of accuracy and at a high speed. A laser irradiation apparatus is used which includes a laser light source for generating a laser beam, a reflection section for reflecting the laser beam toward a required direction, and a control section for controlling whether or not the laser beam is to be irradiated in an interlocking relationship with the reflection section. The laser beam is selectively irradiated on a plurality of devices arranged on a transfer source substrate to cause laser ablation such that the selected devices are transferred to a transfer destination substrate by the selective laser ablation.

17 Claims, 6 Drawing Sheets

LIGHT INTENSITY INDICATING A GAUSS DISTRIBUTION

EXAMPLE OF A DEVICE TO BE TRANSFERRED

DEVICE TRANSFER METHOD

CROSS REFERENCES TO RELATED APPLICATIONS

The present application claims priority to Japanese Patent Application JP2004-184927 filed in the Japanese Patent Office on Jun. 23, 2004, the entire contents of which are incorporated herein by reference.

BACKGROUND

In recent years, in a system such as a computer system, a liquid crystal display apparatus, a plasma display apparatus, an image display apparatus which uses organic EL (Electroluminescence) devices and so forth have been developed, and development of image display apparatus of a reduced weight and thickness have been and are proceeding remarkably. As one of image display apparatus of a reduced weight and thickness, also a display apparatus whose display screen is formed by arranging a plurality of a light emitting diodes used as light emitting devices has been proposed. In an image display apparatus in which a light emitting diode is used, a plurality of light emitting diodes which individually emit blue light, green light and red light are formed on a semiconductor substrate and then arranged in a matrix on a displaying face. Thereafter, formation of wiring lines for driving the light emitting diodes and so forth are performed. In order to arrange the devices formed on the semiconductor substrate at predetermined positions of the display apparatus, transfer of the light emitting diode devices is performed. In order to perform the transfer, a method of disposing devices at required positions using vacuum absorption is widely used. Further, as a technique for forming wiring lines, a wire bonding technique or the like is used.

Light emitting diodes are fabricated using a semiconductor material of a gallium arsenide (GaAs) type, gallium/indium phosphorus (GaInP) type or gallium nitride (GaN) type which are expensive materials. Therefore, it is desirable to make the size of devices smaller in order to decrease the fabrication cost per one device. However, it is difficult to vacuum absorb fine light emitting diodes to arrange the devices at positions corresponding to a display screen and then form required wiring lines. Further, also it is difficult to enhance the positioning accuracy upon the arrangement of the devices. Therefore, also a method has been proposed wherein fine light emitting diode devices formed in an equally spaced relationship from each other on a substrate are selectively exfoliated and transferred to a different substrate. The method is disclosed, for example, in Japanese Patent Laid-Open No. 2003-77940 (hereinafter referred to as Patent Document 1).

In the device transfer method disclosed in Patent Document 1, in order to selectively exfoliate fine light emitting diode devices from a substrate, a laser ablation technique is used wherein a laser beam having a small diameter is irradiated those devices which are to be exfoliated so that chemical variation or mechanical variation on an interface between the substrate and the devices is caused to weaken the bond between the devices and the substrate. In the laser ablation technique, in order to selectively irradiate the laser beam on fine devices formed in a crowded relationship on a semiconductor substrate, a laser beam having a reduced diameter must be irradiated on the devices. Therefore, a method is used wherein the laser beam to be irradiated is condensed by an optical member such as a lens.

SUMMARY

In order to irradiate the laser beam to apply energy between the devices and the substrate in a concentrated manner to exfoliate the devices from the substrate, the energy of the laser beam must be transmitted effectively between the device and the substrate. However, such problems as described just below are liable to appear. In particular, where an optical member is used to condense the laser beam, an image formation pattern of the laser beam to be irradiated on the substrate is disturbed by diffraction of the light or the like, and the irradiation range of the laser beam is not determined because of an influence of the focal distance, focal depth and so forth of the optical member.

It is desirable to provide a device transfer method by which, when the laser ablation technique is used to selectively exfoliate devices arranged on a substrate, the energy is transmitted efficiently to perform transfer of the devices with a high degree of accuracy and at a high speed.

In order to attain the desire described above, according to an embodiment of the present invention, there is provided a device transfer method executed by a laser irradiation apparatus which includes a laser light source for generating a laser beam, a reflection section for reflecting the laser beam from the laser light source toward a required direction, and a control section for controlling whether or not the laser beam is to be irradiated in an interlocking relationship with the reflection section, the method comprising a step of selectively irradiating the laser beam on a plurality of devices arranged on a transfer source substrate so that the selected ones of the devices are transferred to a transfer destination substrate by laser ablation caused by the irradiation of the laser beam.

In the device transfer method, the reflection section for reflecting a laser beam toward a required direction is combined with the control section for controlling whether or not the laser beam is to be irradiated such that the laser beam is irradiated with a high degree of accuracy on selected ones of a plurality of devices arranged on a transfer source substrate. The selected ones of the devices on the transfer source substrate are exfoliated in response to the selective irradiation of the laser beam and transferred to a transfer destination substrate with certainty.

In this instance, the irradiation upon the selected ones of the plurality of devices arranged on the transfer source substrate is performed by a method wherein the devices to be selected are successively irradiated, by another method wherein several ones of the devices which are within a predetermined region are irradiated, or by some other method. The selective irradiation is performed by an apparatus which includes a combination of a shutter mechanism, a scanning mechanism and so forth for the laser beam. Further, a phase diffraction grating or a mask may be applied to the laser beam to achieve enhancement of the accuracy in position or to achieve collective irradiation upon a plurality of devices.

In a preferred embodiment of the present invention, a galvano-mirror is used as the reflection section. Where the laser beam reflected by the galvano-mirror is irradiated on the devices on the transfer source substrate through a scanning lens such as an fθ lens, substantially uniform irradiation of the laser beam is implemented irrespective of whether a certain region of the transfer source substrate is located near to or spaced away from the optical axis of the optical system. Consequently, transfer of the devices can be implemented with a high degree of accuracy.

According to another embodiment of the present invention, there is provided a device transfer method executed by a laser irradiation apparatus which includes a laser light source for generating a laser beam, a reflection section for reflecting the laser beam from the laser light source toward a required direction, and a reducing projection optical section for reducing and projecting the laser beam reflected by the reflection section, the method comprising a step of selectively irradiating the reduced and projected laser beam through a mask on a plurality of devices arranged on a transfer source substrate so that the selected devices are transferred to a transfer destination substrate by laser ablation caused by the irradiation of the laser beam.

Where the laser beam is irradiated upon the devices without the intervention of a mask, there is the possibility that displacement in position of the beam may directly have a bad influence on the transfer efficiency. However, where the laser beam having passed through the mask is irradiated on the devices using the reducing projection optical section, even if some displacement in position of the laser beam occurs, the mask compensates for the displacement in position, and consequently, reliable transfer of the devices is implemented. Where, as a preferred form of the present invention, a galvano-mirror is used as the reflection section such that the laser beam reflected by the galvano-mirror is irradiated upon the devices on the transfer source substrate through a scanning lens such as an fθ lens, the beam can be irradiated with a high degree of accuracy. Further, since the laser beam is projected through the reducing projection optical system, transfer is implemented which involves a very small amount of displacement in position in the form wherein the beam irradiation with a high degree of accuracy is reduced in scale as it is.

In summary, with the device transfer methods of the present invention, when devices arranged on a substrate are to be selectively exfoliated, energy can be transmitted efficiently to perform transfer of the devices with a high degree of accuracy and at a high speed. Particularly where the laser beam reflected by a galvano-mirror as the reflection section is irradiated on the devices on the transfer source substrate through a scanning lens such as an fθ lens, substantially uniform irradiation of the laser beam is implemented irrespective of whether a certain region on the transfer source substrate is located near to or spaced away from the optical axis of the optical system. Consequently, transfer of the devices is performed with a high degree of accuracy and at a high speed.

The above and other objects, features and advantages of the present invention will become apparent from the following description and the appended claims, taken in conjunction with the accompanying drawings in which like parts or elements denoted by like reference symbols.

Additional features and advantages of the present invention are described in, and will be apparent from, the following Detailed Description of the Invention and the figures.

BRIEF DESCRIPTION OF THE FIGURES

FIGS. 3A and 3B are schematic views showing an example of a scanning method of a laser beam used in the device transfer method according to the first embodiment of the present invention, and wherein FIG. 3A is a schematic view of an irradiation region and FIG. 3B is a waveform diagram showing the intensity of the beam.

FIGS. 4A and 4B are schematic views showing another example of a scanning method of a laser beam used in the device transfer method according to the first embodiment of the present invention, and wherein FIG. 4A is a schematic view of an irradiation region and FIG. 4B is a waveform diagram showing the intensity of the beam.

FIGS. 8A and 8B are views illustrating a diffraction state of a laser beam used in the device transfer method according to the third embodiment of the present invention, and wherein FIG. 8A is a view showing a spot of a laser beam and FIG. 8B is a view showing a state of a peak of diffraction light.

DETAILED DESCRIPTION

The present invention relates to a device transfer method for selectively transferring a plurality of devices arranged on a transfer source substrate to a different substrate, and more particularly to a device transfer method capable of transferring fine devices formed on a substrate with a high degree of accuracy and at a high speed using a laser beam.

Figure 1:
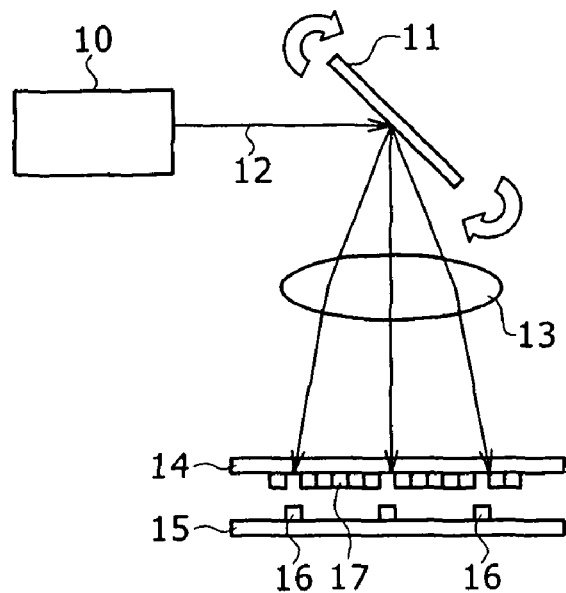
FIG. 1 is a schematic view illustrating a device transfer method according to an embodiment of the present invention.

Referring first to FIG. 1, there is shown a laser irradiation apparatus used an example of a device transfer method according to the present invention. In the device transfer method of the present embodiment, devices on a transfer source substrate are selectively exfoliated by laser ablation and transferred to a transfer destination substrate. In the method of the present embodiment, a plurality of cylindrical light emitting diodes are transferred.

As shown in FIG. 1, in the present embodiment, a DPSS (Diode Pumped Solid State) type YAG laser 10 is used as a laser light source, and light 12 emitted from the YAG laser 10 comes to a biaxial galvano-mirror 11. If the galvano-mirror 11 as a reflection section is oscillated over a fixed angle, then outgoing light from the galvano-mirror 11 is scanned, and the resulting light enters an fθ lens 13 as a scanning lens. By the combination of the galvano-mirror 11 and the fθ lens 13, substantially uniform irradiation of a laser beam is achieved irrespective of whether the irradiation target region is provided near to or spaced away from the optical axis of the optical system. Consequently, transfer of devices can be implemented with a high degree of accuracy.

The laser beam outgoing from the fθ lens 13 is irradiated upon a transfer source substrate 14 wherein a plurality of devices 17 are arranged on the bottom face side. The transfer source substrate 14 passes the laser beam therethrough like, for example, a sapphire substrate. The laser beam passing through the transfer source substrate 14 is absorbed by an interface of the devices 17 which is a bottom face of the transfer source substrate 14, and a laser ablation phenomenon of gasifying a crystal material occurs. By the combination of the galvano-mirror 11 and the fθ lens 13 described above, the laser beam is scanned at a high speed in X-Y directions.

In the transfer method of the present embodiment, the devices 17 are selectively transferred from the transfer source substrate 14 to a transfer destination substrate 15. In FIG. 1, devices 16 on the transfer destination substrate 15 have been transferred from the transfer source substrate 14 by selective irradiation of the laser beam. Upon the selective irradiation of the laser beam, the laser ablation occurs on the interface of any of devices upon which the laser beam is irradiated, and the device is transferred from the transfer source substrate 14 to the transfer destination substrate 15 in accordance with the evaporation action of the laser ablation. While also it is possible to apply a structure wherein a mask is provided in order to selectively irradiate the laser beam upon the devices as described below, if the mask is provided such that the laser beam to be scanned is combined with a high speed on/off operation of the power supply to the laser light source or a high speed shutter to be disposed on an optical path, then the selective irradiation of the laser beam upon the devices can be implemented. In this instance, in the laser irradiation apparatus, a control section is formed from the mask, high speed shutter, switching mechanism and so forth. If an adhesive or the like is applied to the transfer destination substrate 15 and the transfer source substrate 14 is disposed in an adjacently opposed relationship with respect to the transfer destination substrate 15, then the devices 16 can be transferred and fixed to desired positions of the transfer destination substrate 15.

By the combination of the galvano-mirror 11 and the fθ lens 13 described above, the amount of light to be irradiated upon selected devices can be uniformized irrespective of the positions of the devices. Further, if the shape of the devices 16 and 17 formed from light emitting diodes is set to a cylindrical shape, then the interface between the devices formed on the transfer source substrate 14 and the substrate exhibits a cylindrical shape. In this instance, since the shape of the interface is approximated to that of a spot of the laser beam, the energy can be utilized for the ablation wastelessly, and the transfer process can be carried out efficiently.

Figure 2:
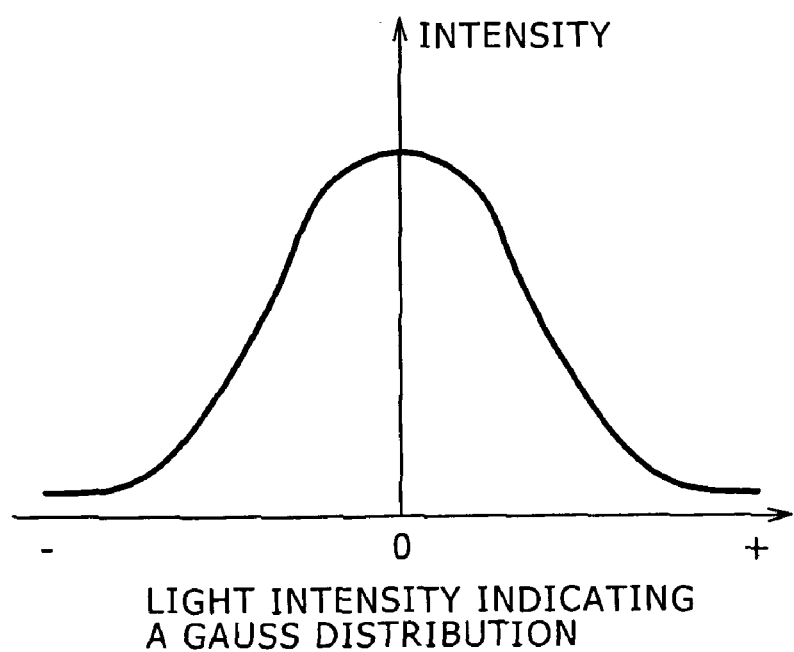
FIG. 2 is a light intensity distribution diagram showing a profile of a laser beam used in the device transfer method according to an embodiment of the present invention.

FIG. 2 illustrates a distribution of the light intensity of the laser beam used in the present embodiment. In the device transfer method of the present embodiment, the light intensity distribution of the laser beam indicates a gauss distribution. If a device to be transferred is structured so as to have an interface of a circular shape or an elliptical shape, then the shape of a spot of the laser beam becomes same as or similar to that of a region which requires the laser ablation of the device to be transferred. As a result, the optical energy of the laser beam can be efficiently utilized for the laser ablation. Further, in the case of the gauss distribution wherein the spot shape of the laser beam is a circular shape or an elliptical shape, diffraction at a portion of an edge can be avoided and transfer of devices can be implemented with a high degree of accuracy.

Figure 3A:
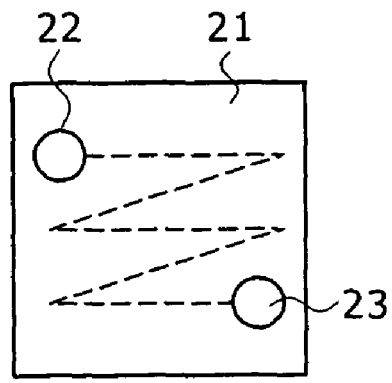
Figure 3B:
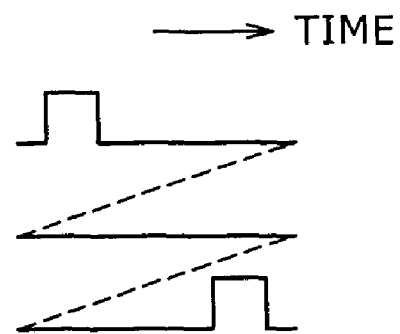

FIGS. 3A and 3B illustrate scanning of the laser beam by the galvano-mirror, and wherein FIG. 3A shows a locus of scanning lines and FIG. 3B is a waveform diagram illustrating the state of the light intensity corresponding to the position of each scanning line. Where the laser beam is selectively irradiated upon the devices during scanning to cause the laser ablation, a shutter for the laser beam being scanned is opened at positions 22 and 23 of a region 21 and the laser beam during passing the positions 22 and 23 reaches the interface between a device 17 and the transfer source substrate 14. Laser ablation is caused by the laser beam having reached the interface, and devices corresponding to the positions 22 and 23 of the region 21 are exfoliated and transferred by the laser ablation. It is to be noted that, while, in FIGS. 3A and 3B, the laser beam is irradiated upon one position on one horizontal scanning line segment, the laser beam may be irradiated upon a plurality of positions on one horizontal scanning line segment.

Figure 4A:
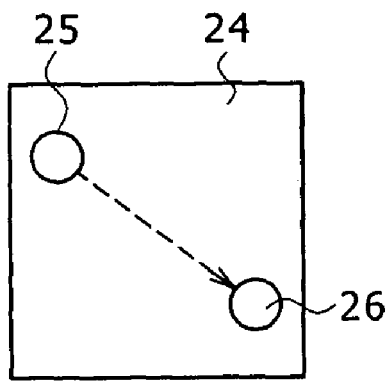
Figure 4B:
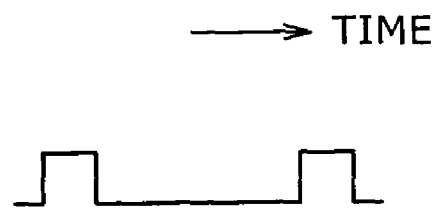

FIGS. 4A and 4B illustrate another example wherein the scanning is performed using a different reflection section, and wherein FIG. 4A shows a locus of a scanning line and FIG. 4B is a waveform diagram showing a state of the light intensity on the scanning line. Here, a method is illustrated wherein the laser beam is irradiated substantially linearly upon a plurality of selective positions using a method changed from the scanning method of the galvano-mirror described hereinabove or using a reflection section such as a polygon mirror. By such a scanning method as just described, also the laser beam can be irradiated upon devices at a plurality of positions 25 and 26 in a region 24 in a shorter period of time.

Figure 5:
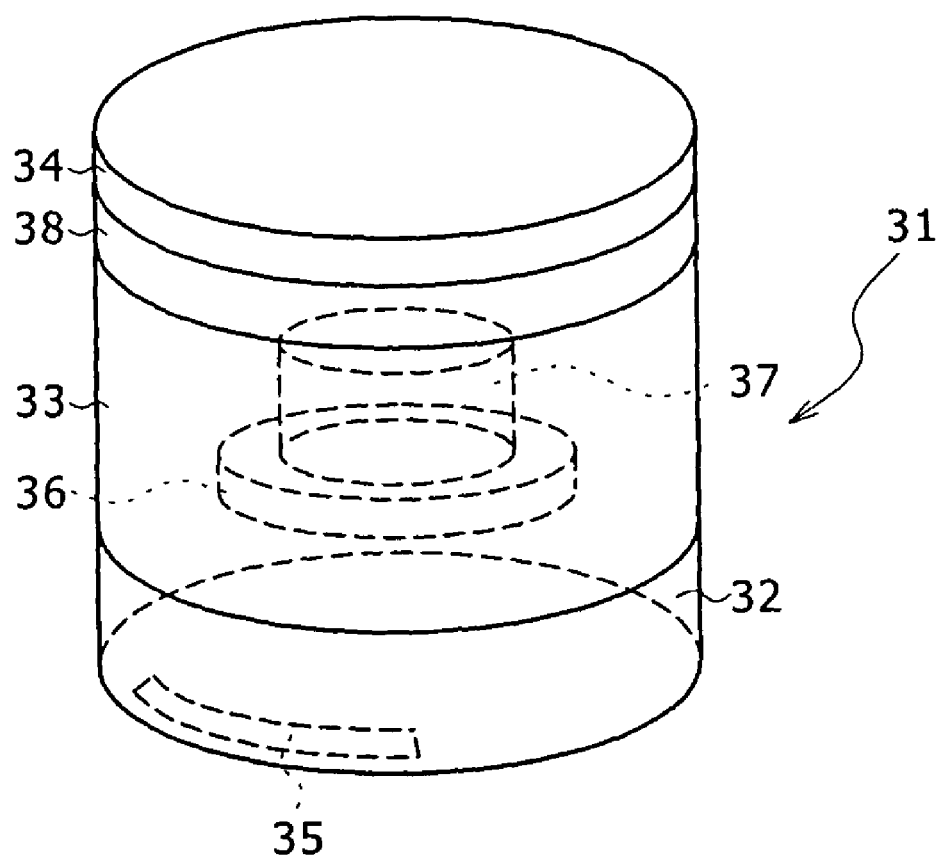
FIG. 5 is a schematic perspective view of a device to be transferred by the device transfer method according to an embodiment of the present invention.

In the device transfer method of the present embodiment, while devices having various shapes can be transferred, a device having such a cylindrical shape as shown in FIG. 5 can be efficiently transferred. The cylindrical device shown in FIG. 5 is a fine light emitting diode 31 of a cylindrical shape. Further, the cylindrical device is an example of a device wherein an n-type GaN layer 32 is formed on the bottom face side and a p-type GaN layer 38 and a p side electrode 34 are formed on the top face side with an insulation layer 33 interposed therebetween. In the inside of the insulation layer 33, a semiconductor layer 36 including an active layer such as a multiple quantum well structure is formed at a lower portion of a connection section 37. The device emits light by supplying current from the p side electrode 34 to the semiconductor layer 36.

In the present embodiment, while a device which is a transfer object is a light emitting diode, the device transfer method of the present invention is not limited to this, but can transfer various devices. Examples of devices to which the device transfer method of the present invention can be applied are listed below. In particular, a device selected from a light emitting device, a pixel controlling device, a liquid crystal controlling device, a photoelectric conversion device, an electrothermal conversion device, a piezoelectric device, a thin film transistor device, a thin film diode device, a resistance device, a switching device, a fine magnetic device, a power generation device, a capacitance device, a fine mechanical device, a fine flow path forming device, a fine optical device, and some other device or a portion of the device or the like can be transferred as a device. It is to be noted that, while an overlapping description is omitted herein, the fact that the present invention can be applied to various devices in this manner similarly applies also to embodiments hereinafter described.

In the device transfer method of the present embodiment, while a YAG laser is used as a laser light source, also a visible radiation laser can be used as a laser light source in the transfer method of the present invention. Where a visible radiation laser is used as a laser light source, a metal film is formed on the interface between the transfer source substrate and the devices, and the visible radiation laser beam is selectively irradiated upon the metal film. By the selective irradiation of the visible radiation laser, the laser ablation is caused in the proximity of the metal film, and the devices can be transferred from the transfer source substrate to the transfer destination substrate.

With the device transfer method of the present embodiment, by the combination of the galvano-mirror 11 and the fθ lens 13, substantially uniform irradiation of a laser beam is implemented irrespective of whether the irradiation target region is provided near to or spaced away from the optical axis of the optical system. Since the laser beam is selectively irradiated upon the devices during scanning to cause the laser ablation in the region of the devices, a high speed transfer process can be implemented. Further, where the spot shape of the laser beam is set to a circular shape or an elliptical shape, diffraction at an edge can be avoided and transfer of devices can be implemented with a high degree of accuracy.

In a device transfer method according to another embodiment of the present invention, devices on a transfer source substrate are selectively exfoliated by laser ablation and transferred to a transfer destination substrate. The device transfer method of the second embodiment implements highly accurate transfer of devices by scanning a laser beam using a combination of a galvano-mirror and an fθ lens and processing the scanned laser beam by means of a reducing projection optical system.

Figure 6:
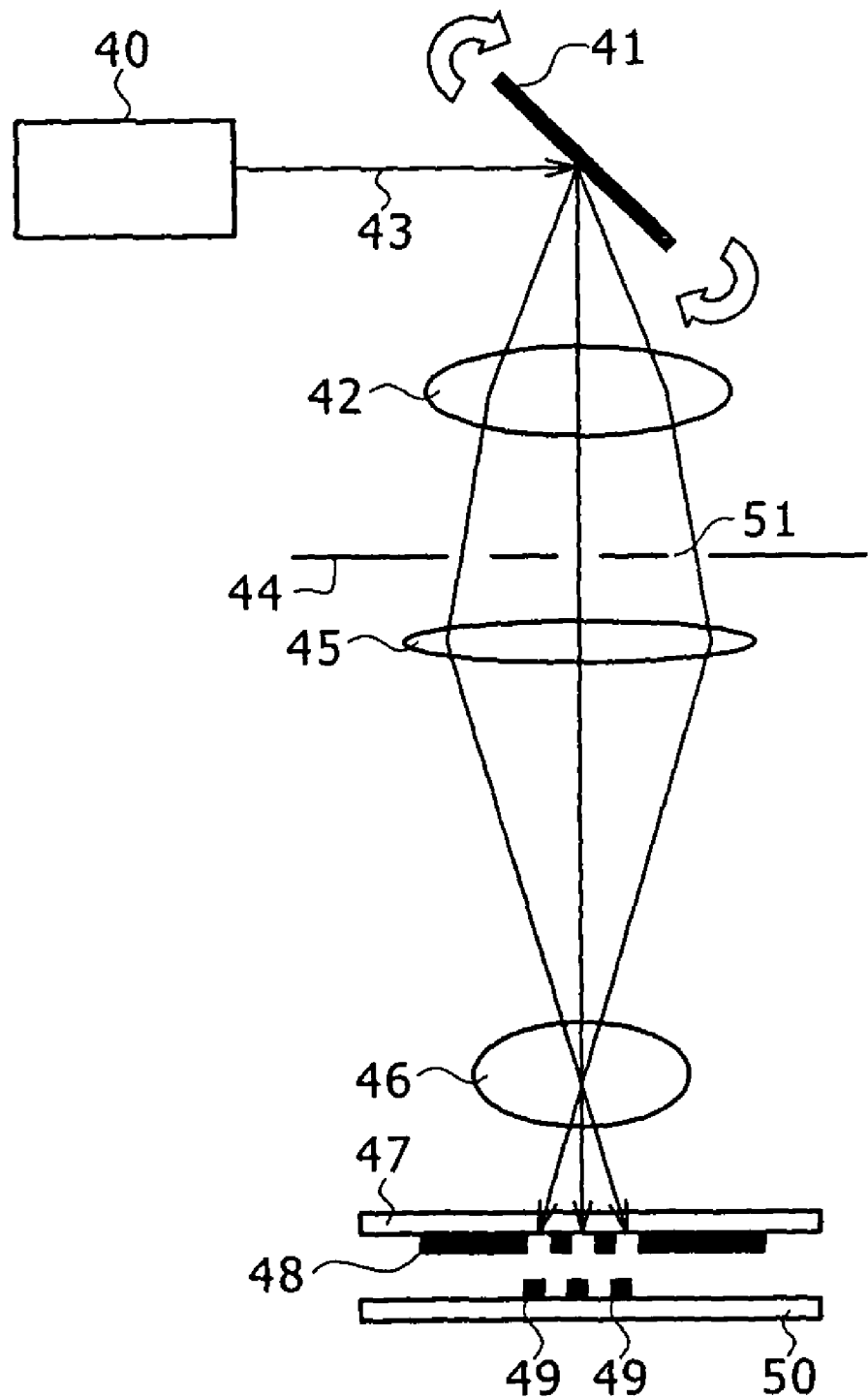
FIG. 6 is a schematic view illustrating a device transfer method according to another embodiment of the present invention.

Referring to FIG. 6, according to the present embodiment, a DPSS (Diode Pumped Solid State) type YAG laser 40 is used as a laser light source, and emerging light 43 from the YAG laser 40 enters a biaxial galvano-mirror 41. The galvano-mirror 41 as a reflection section is oscillated over a fixed angle to scan the emerging light of the galvano-mirror 41, and the scanned light enters an fθ lens 42 serving as a scanning lens. By the combination of the galvano-mirror 41 and the fθ lens 42, substantially uniform irradiation of a laser beam is implemented irrespective of whether the irradiation target region is positioned in the proximity of or spaced away from the optical axis of the optical system.

An output of the fθ lens 42 has uniformity which does not depend upon the place while it is scanned, and transfer of devices with a high degree of accuracy can be implemented by utilizing a mask and a reducing optical system for such a light source as just described. In particular, light emerging from the fθ lens 42 enters a field lens 45 through openings 51 of a mask 44, and the light emerging from the field lens 45 forms an image on the transfer substrate side through a projection lens 46. If the laser beam having passed through the openings 51 of the mask 44 is used as a light source for selective transfer, then where the beam has displacement out of position, such displacement cannot be compensated for by such a mechanism as a shutter. However, use of the openings 51 of the mask 44 can compensate for the displacement of the beam with certainty. Further, where the laser beam is selectively irradiated using a shutter mechanism not shown as well, since the mask 44 exists, the laser beam can be scanned providing some margin to the operation of the shutter mechanism. Consequently, reduction of the cost of the shutter mechanism itself and so forth can be anticipated.

The light outputted from the projection lens 46 enters a transfer source substrate 47 with a high degree of accuracy and comes to the interface between the transfer source substrate 47 and devices 48 which are on the bottom face side of the transfer source substrate 47. Thus, laser ablation is caused at the interface. By the laser ablation, devices 48 arranged on the bottom face of the transfer source substrate 47 are selectively exfoliated, and the exfoliated devices 49 are disposed at predetermined positions of a transfer substrate 50. An adhesive or the like may be applied in advance to the transfer substrate 50 in order to secure the 49.

In the device transfer method of the present embodiment, by the combination of the galvano-mirror 41 and the fθ lens 42, substantially uniform irradiation of the laser beam is implemented irrespective of whether the irradiation target region is positioned in the proximity of or spaced away from the optical axis of the optical system. Further, the displacement in position of the beam can be compensated for with certainty by use of the openings 51 of the mask 44 in the reducing projection optical system. Consequently, reduction of the cost of the shutter mechanism itself and so forth can be anticipated.

Figure 7:
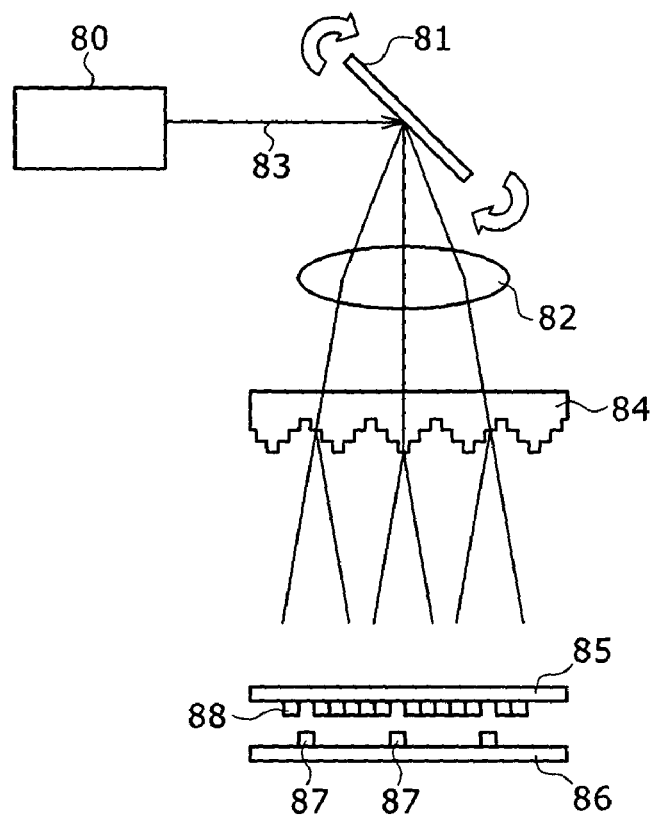
FIG. 7 is a schematic view illustrating a device transfer method according to a further embodiment of the present invention.

FIG. 7 illustrates a further embodiment of the present invention. In the device transfer method of the present embodiment, a phase diffraction grating is interposed in an optical path of a laser beam such that optical energy is distributed efficiently to a plurality of patterns by a diffraction phenomenon by the phase diffraction grating so that, also where selective transfer is performed for a comparatively large region, such transfer can be performed at a high speed.

Similarly as in the embodiments described hereinabove, a DPSS (Diode Pumped Solid State) type YAG laser 80 is used as a laser light source, and emerging light from the YAG laser 80 is introduced to a biaxial galvano-mirror 81. The galvano-mirror 81 as a reflection device is oscillated over a fixed angle to scan the emerging light of the galvano-mirror 81, and the scanned light enters an fθ lens 82 serving as a scanning lens. By the combination of the galvano-mirror 81 and the fθ lens 82, substantially uniform irradiation of a laser beam is implemented irrespective of whether the irradiation target region is positioned in the proximity of or spaced away from the optical axis of the optical system.

Figure 8A:
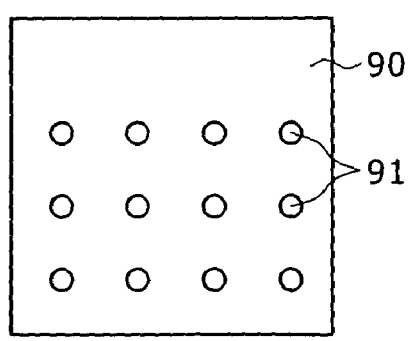
Figure 8B:
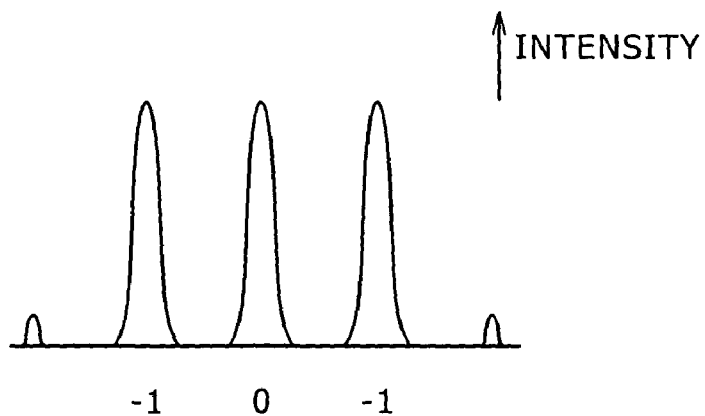

The light emerging from the fθ lens 82 as a scanning lens enters a phase diffraction grating 84 for spatially distributing the laser beam, and the single beam can be split into a plurality of beams making use of a diffraction phenomenon of the phase diffraction grating 84. FIGS. 8A and 8B illustrate a manner of such spatial distribution of a laser beam as just described, and FIG. 8A particularly illustrates an example wherein a laser beam is distributed to spots 91 in a matrix in a certain region 90. Such patterns as just described can be obtained comparatively readily where peaks of optical energy are obtained in a spatially dispersed condition as seen in FIG. 8B by 0th-order diffraction light and ±first-order diffraction light of the laser beam having passed through the phase diffraction grating 84.

For example, where a plurality of devices are disposed in a matrix, to distribute a beam regularly as seen in FIG. 8A is advantageous where transfer is performed while the devices are sampled out. The method which utilizes a phase diffraction grating in the present embodiment is preferable where laser ablation is caused selectively while devices are sampled out to increase the distance between the devices.

In the example shown in FIG. 7, the laser beam having passed through the phase diffraction grating 84 and dispersed into a plurality of beams enters a transfer source substrate 85, and a plurality of devices 88 are transferred so that the transferred devices 87 are disposed on a transfer destination substrate 86.

While, in the example shown in FIG. 7, the laser beam is scanned by the galvano-mirror 81 to perform selective transfer of devices, in order to perform the selective transfer over a greater region, the phase diffraction grating 84 or the transfer source substrate 85 may be moved in parallel to each other in response to the control of the galvano-mirror 81. Further, while, in the present embodiment, the phase diffraction grating 84 is used as an optical member for splitting a laser beam into a plurality of beams, some other diffraction gratings or some other optical members may be used instead.

Figure 9:
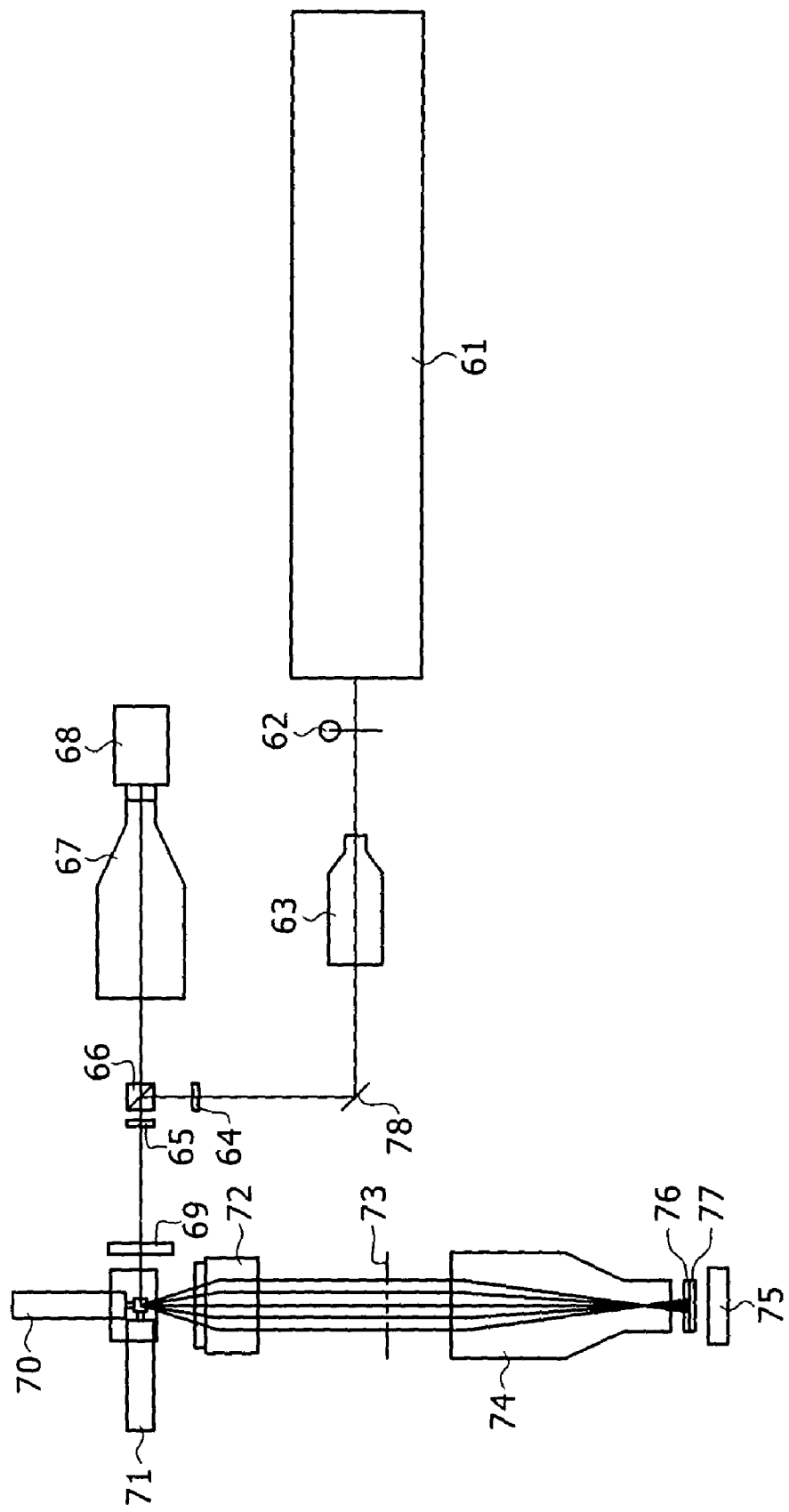
FIG. 9 is a schematic view particularly illustrating a device transfer method according to a fourth embodiment of the present invention.

FIG. 9 shows a laser irradiation system for carrying out a device transfer method according to another embodiment of the present invention. Referring to FIG. 9, a laser beam generated by a pulse laser 61 enters a beam expander 63 through a shutter 62, and an output of the beam expander 63 comes to a beam splitter 66 through a reflecting mirror 78 and a half-wave plate 64. The beam splitter 66 functions as a half mirror and functions so as to distribute incoming light from the pulse laser 61 and light from a ruminator 75 below substrates 76 and 77, between which transfer is performed. The light from the substrates 76 and 77 enters a lens 67 through the beam splitter 66 and forms an image on an image pickup section of an area scan camera 68 through the lens 67. An operator of the laser irradiation system can monitor the manner of transfer by means of the area scan camera 68.

A laser beam generated by the pulse laser 61 passes, after it goes out from the beam splitter 66, through a quarter-wave plate 65 and a polarizing plate 69 and enters biaxial galvano-mirrors 70 and 71. The beam is deflected in an X direction and a Y direction by the galvano-mirrors 70 and 71, respectively, and the laser beam conforming to the deflected angle enters a scanning lens 72. The scanning lens 72 is formed from, for example, an fθ lens similarly as in the embodiments described hereinabove and functions so as to uniformize the distribution of the beam within the region of the scanning. Further, the laser beam outputted from the scanning lens 72 is a parallel ray of light and enters as such into a projection lens 74 and is projected on the substrates 76 and 77 by the projection lens 74. A mask 73 is interposed between the scanning lens 72 and the projection lens 74 such that selective irradiation of the laser beam is performed while the position of the beam is compensated for by the mask 73 or in accordance with patterns of openings of the mask 73.

In the transfer method of the fourth embodiment, a laser beam suitable for reducing projection is outputted from the combination of the scanning lens 72 and the galvano-mirrors 70 and 71 via the scanning lens 72 to the projection lens 74, and in this state, compensation for the beam position is performed by the mask 73 while the laser beam is in the form of a parallel ray of light. Consequently, selective transfer of devises can be performed with a high degree of accuracy, and transfer of devices of a high reproducibility is implemented by laser ablation which is caused by the irradiation.

It is to be noted that, while, in the embodiments described above, a single laser light source and an optical system therefor are described, the present invention can be applied also to another mechanism wherein a plurality of laser light sources are irradiated collectively by a single optical system and also to a further mechanism wherein a single laser beam is irradiated by a plurality of optical systems.

While preferred embodiments of the present invention have been described using specific terms, such description is for illustrative purposes only, and it is to be understood that changes and variations may be made without departing from the spirit or scope of the following claims.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention is claimed as follows:

1. A device transfer method comprising:
generating a laser beam from a laser light source;
reflecting with a reflection section the laser beam generated from said laser light source toward a required direction, wherein the reflection section is oscillated over a fixed angle;
uniformizing with a scanning lens light entering said scanning lens;
controlling with a control section whether or not the laser beam is to be irradiated in an interlocking relationship with said reflection section, the scanning lens being interposed between said reflection section and said control section; and
selectively irradiating the laser beam on a plurality of devices arranged on a transfer source substrate so that the devices that are selected are transferred to a transfer destination substrate by laser ablation caused by the irradiation of the laser beam, wherein a light intensity distribution of the laser beam is a Gaussian distribution.

2. The device transfer method according to claim 1, wherein the transfer source substrate or the devices pass the laser beam therethrough, and the devices are selectively exfoliated from the transfer source substrate utilizing laser ablation caused on an interface between the transfer source substrate and the devices so that the selectively exfoliated devices are transferred to the transfer destination substrate.

3. The device transfer method according to claim 1, wherein said laser light source is an ultraviolet laser.

4. The device transfer method according to claim 1, wherein said laser light source is a visible laser, and a metal film is formed on an interface between the transfer source substrate and the devices, the devices being transferred from the transfer source substrate to the transfer destination substrate utilizing laser ablation caused in proximity of said metal film by selective irradiation of visible rays from the visible laser on said metal film.

5. The device transfer method according to claim 1, wherein said reflection section is a galvano-mirror.

6. The device transfer method according to claim 5, wherein the laser beam reflected by said galvano-mirror is selectively irradiated upon the devices through a scanning lens.

7. The device transfer method according to claim 6, wherein said scanning lens is an fθ lens.

8. The device transfer method according to claim 6, wherein the laser beam is branched into a plurality of beams by a phase diffraction grating interposed between said scanning lens and the devices arranged on the transfer source substrate, and the branched laser beams are irradiated upon the transfer source substrate so that the devices are selectively transferred to the transfer destination substrate by the laser ablation.

9. The device transfer method according to claim 1, wherein said control section is formed from at least are of a shutter disposed on an optical path of the laser beam, a mask having an opening, and a control apparatus for controlling the irradiation of the laser beam from said laser light source.

10. A device transfer method comprising:
generating a laser beam from a laser light source;
reflecting with a reflection section the laser beam from said laser light source toward a required direction, wherein the reflection section is oscillated over a fixed angle;
uniformizing with a scanning lens light entering said scanning lens and a reducing projection optical section for reducing and projecting the laser beam reflected by said reflection section, the scanning lens being interposed between said reflection section and said control section; and
selectively irradiating the reduced and projected laser beam through a mask on a plurality of devices arranged on a transfer source substrate so that the devices that are selected are transferred to a transfer destination substrate by laser ablation caused by the irradiation of the laser beam, wherein a light intensity distribution of the laser beam is a Gaussian distribution.

11. The device transfer method according to claim 10, wherein said reflection section is a galvano-mirror, and the laser beam enters said reducing projection optical section through said mask.

12. A device transfer method comprising:
generating a laser beam with a laser light source;
reflecting with a reflection section the laser beam from said laser light source toward a required direction, wherein the reflection section is oscillated over a fixed angle;
uniformizing with a scanning lens light entering said scanning lens and a reducing projection optical section for reducing and projecting the laser beam reflected by said reflection section, the scanning lens being interposed between said reflection section and said control section; and
selectively irradiating the reduced and projected laser beam through a phase diffraction grating on a plurality of devices arranged on a transfer source substrate so that the devices that are selected are transferred to a transfer destination substrate, wherein a light intensity distribution of the laser beam is a Gaussian distribution.

13. The device transfer method according to claim 12, wherein said reflection section is a galvano-mirror, and the laser beam enters said reduction and projection optical section through said phase diffraction grating.

14. A device thinning out method executed by a laser irradiation apparatus, the method comprising:
generating a laser beam from a laser light source;
reflecting with a reflection section the laser beam from said laser light source toward a required direction, wherein the reflection section is oscillated over a fixed angle;
uniformizing with a scanning lens light entering said scanning lens;
controlling with a control section whether or not the laser beam is to be irradiated in an interlocking relationship with said reflection section, the scanning lens being interposed between said reflection section and said control section; and
selectively irradiating the laser beam on a plurality of devices arranged on a substrate so that the devices that are selected are exfoliated from the substrate by laser ablation caused by the irradiation of the laser beam thereby to thin out the devices, wherein a light intensity distribution of the laser beam is a Gaussian distribution.

15. The device transfer method according to claim 1, wherein the shape of said devices is set to a cylindrical shape.

16. The device transfer method according to claim 1, wherein the laser beam is irradiated as substantially uniform irradiation irrespective of whether a certain region of the transfer source substrate is located near to or away from an optical axis of the laser beam.

17. The device transfer method according to claim 1, wherein said reflection section is a biaxial galvano-mirror.

* * * * *